(12) United States Patent
Ho et al.

(10) Patent No.: US 11,315,881 B1
(45) Date of Patent: Apr. 26, 2022

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chi-Ching Ho, Taichung (TW); Bo-Hao Ma, Taichung (TW); Chee-Key Chung, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 17/122,289

(22) Filed: Dec. 15, 2020

(30) Foreign Application Priority Data

Oct. 27, 2020 (TW) ................................. 109137260

(51) Int. Cl.
*H01L 23/538* (2006.01)
*H01L 23/00* (2006.01)
*H01L 21/683* (2006.01)
*H01L 21/48* (2006.01)
*H01L 21/56* (2006.01)
*H01L 23/31* (2006.01)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5381* (2013.01); *H01L 23/5383* (2013.01); *H01L 23/5386* (2013.01); *H01L 23/562* (2013.01); *H01L 24/19* (2013.01); *H01L 24/20* (2013.01); *H01L 2221/68372* (2013.01); *H01L 2224/214* (2013.01); *H01L 2924/3511* (2013.01)

(58) Field of Classification Search
CPC ............. H01L 23/5389; H01L 21/4853; H01L 21/4857; H01L 21/565; H01L 21/568; H01L 21/6835; H01L 23/3128; H01L 23/5381; H01L 23/5383; H01L 23/5386; H01L 23/562; H01L 24/19; H01L 24/20; H01L 2221/68372; H01L 2224/214; H01L 2924/3511
USPC ......................................... 257/668
See application file for complete search history.

(56) References Cited

U.S. PATENT DOCUMENTS 10,998,272 B2 * 5/2021 Aleksov .............. H01L 23/5389
11,018,080 B2 * 5/2021 Weerasekera ....... H01L 21/4857
11,164,817 B2 * 11/2021 Rubin .................... H01L 24/10

* cited by examiner

Primary Examiner — Vu A Vu
(74) Attorney, Agent, or Firm — Kelly & Kelley, LLP

(57) ABSTRACT

An electronic package is provided, in which at least one first electronic component is arranged on one surface of a circuit structure with circuit layers and a plurality of second electronic components are arranged on the other surface. The first electronic component can electrically bridge two of the plurality of second electronic components via the circuit layers to replace part of the circuit layers of the circuit structure, so that the circuit layers of the circuit structure can maintain a larger wiring specification and reduce the number of circuit layers, thereby improving the process yield.

14 Claims, 13 Drawing Sheets

ELECTRONIC PACKAGE AND MANUFACTURING METHOD THEREOF

BACKGROUND

1. Technical Field

The present disclosure relates to a semiconductor device, and more particularly, to an electronic package having an electrical bridging structure and a manufacturing method thereof.

2. Description of Related Art

The rapid development of electronic industry has brought about electronic products with multiple functions and high performance, and the need for high frequency high speed operations has meant that the electronic industry is progressively moving towards multi-chip homogeneous integration/heterogeneous integration. Existing techniques used in the field of chip packaging include flip-chip packaging modules, such as chip scale package (CSP), direct chip attached (DCA) and multi-chip module (MCM), chip stacking techniques involving stacking chips into three-dimensional (3D) integrated circuits (ICs), package on package (PoP) stack packaging technique, or the like. Among them, PoP is most widely adopted.

FIG. 1 is a cross-sectional diagram depicting a conventional package structure 1 in the form of a PoP stack. As shown in FIG. 1, the conventional package structure 1 includes: a wiring structure 16, a first functional chip 13 disposed on an upper side of the wiring structure 16, a plurality of conductive pillars 14 disposed on the upper side of the wiring structure 16, an encapsulation layer 15 encapsulating the first functional chip 13 and the plurality of conductive pillars 14, a circuit structure 10 having a plurality of circuit layers 101 disposed on the encapsulation layer 15, a plurality of second functional chips 12 disposed on the circuit structure 10, an encapsulation layer 15' encapsulating the plurality of second functional chips 12, and a plurality of solder balls 17 disposed on a lower side of the wiring structure 16.

In subsequent applications, the package structure 1 can be further connected onto a circuit board 1' via the plurality of solder balls 17.

However, in the conventional package structure 1, the larger the number of functional chips integrated, the greater the number of contacts (I/O) for each of the functional chips, such that the pitch between each of the contacts becomes smaller, and the wiring process of the circuit structure 10 for electrically connecting these functional chips becomes more challenging, resulting in higher manufacturing cost. For example, if the line width/line spacing (L/S) of the wiring specifications of the circuit structure 10 at the place where it is connected to the contacts of the second functional chips 12 is 10/10 microns, although the L/S of the wiring specifications of the circuit structure 10 is larger, but more circuit layers 101 (e.g., more than three layers, such as five layers) need to be fabricated for the circuit structure 10, resulting in poor yield of the circuit structure 10 owing to the greater number of circuit layers 101.

On the other hand, if the L/S of the wiring specifications of the circuit structure 10 is 2/2 microns, then despite that less circuit layers 101 (e.g., less than three layers, such as two layers) can be fabricated for the circuit structure 10, the level of difficulty for fabricating the circuit layers 101 of the circuit structure 10 is increased due to their smaller wiring specifications, resulting in that the yield of the circuit structure 10 cannot meet the requirement.

Therefore, there is a need for a solution that addresses the aforementioned issues in the prior art.

SUMMARY

In view of the aforementioned shortcomings of the prior art, the present disclosure provides an electronic package, which may include: a circuit structure having a first surface and a second surface opposite to each other and a circuit layer; at least one first electronic component disposed on the first surface of the circuit structure and electrically connected with the circuit layer; a plurality of second electronic components disposed on the second surface of the circuit structure and electrically connected with the circuit layer, wherein two of the plurality of second electronic components are electrically bridged by the first electronic component via the circuit layer, and wherein a vertically projected area of the first electronic component with respect to the first surface may be smaller than a vertically projected area of each of the second electronic components which the first electronic component electrically bridges with respect to the first surface; and an encapsulant encapsulating at least one of the first electronic component and the second electronic components.

The present disclosure further provides a method of manufacturing an electronic package, which may include: providing a circuit structure having a first surface and a second surface opposite to each other and a circuit layer; arranging at least one first electronic component on the first surface of the circuit structure and arranging a plurality of second electronic components on the second surface of the circuit structure, wherein two of the plurality of second electronic components are electrically bridged by the first electronic component via the circuit layer, and wherein a vertically projected area of the first electronic component with respect to the first surface may be smaller than a vertically projected area of each of the second electronic components which the first electronic component electrically bridges with respect to the first surface; and encapsulating at least one of the first electronic component and the second electronic components by an encapsulant.

In the aforementioned electronic package and the manufacturing method thereof, the vertically projected area of the first electronic component with respect to the first surface may be 0.01 to 0.5 times the vertically projected area of the second electronic component to which the first electronic component electrically bridges with respect to the first surface.

In the aforementioned electronic package and the manufacturing method thereof, the first electronic component may cover a portion of the second electronic components which the first electronic component electrically bridges. For example, the portion of the second electronic components may be defined as a densely distributed region of electrode pads.

In the aforementioned electronic package and the manufacturing method thereof, the first electronic component may be a bridge chip.

In the aforementioned electronic package and the manufacturing method thereof, a package structure may be further provided on the encapsulant and electrically connected with the circuit structure, wherein the package structure includes a wiring structure and at least one functional electronic component bonded to the wiring structure. For example, the circuit structure may be electrically connected with the wiring structure via conductive structures.

As can be understood from the above, in the electronic package of the present disclosure and the manufacturing method thereof, part of the circuit layers of the circuit structure may be replaced by the first electronic component, so that the second electronic components are electrically bridged by the first electronic component. This lowers the difficulty of the conventional wiring process for the circuit structure for connecting with a functional chip. Thus, compared to the prior art, the present disclosure improves the yield and lowers the cost.

In addition, portions of the circuit layers of the circuit structure are replaced by the first electronic component. As a result, a larger L/S specification can be maintained for the circuit layers of the circuit structure, while reducing the number of circuit layers of the circuit structure to be manufactured. Thus, compared to the prior art, the manufacturing method of the present disclosure is capable of improving the process yield of the circuit structure, thereby reducing the manufacturing cost of the overall package structure of the electronic package.

Furthermore, the size of the first electronic component can be adjusted to balance the stress distribution in the electronic package. Thus, compared to the prior art, the manufacturing method of the present disclosure enhances the reliability of the electronic package by preventing warpage through adjustment of the size of the first electronic component.

BRIEF DESCRIPTION OF THE DRAWINGS

FIG. 2A to FIG. 2E, FIG. 2F-1 and FIG. 2G are schematic cross-sectional diagrams illustrating a manufacturing method of an electronic package in accordance with a first embodiment of the present disclosure.

FIG. 2F-2 is a schematic partial top view corresponding to FIG. 2F-1.

FIG. 2F-3 to FIG. 2F-5 are schematic top views corresponding to FIG. 2F-2 in different aspects.

DETAILED DESCRIPTION

Figure 1:
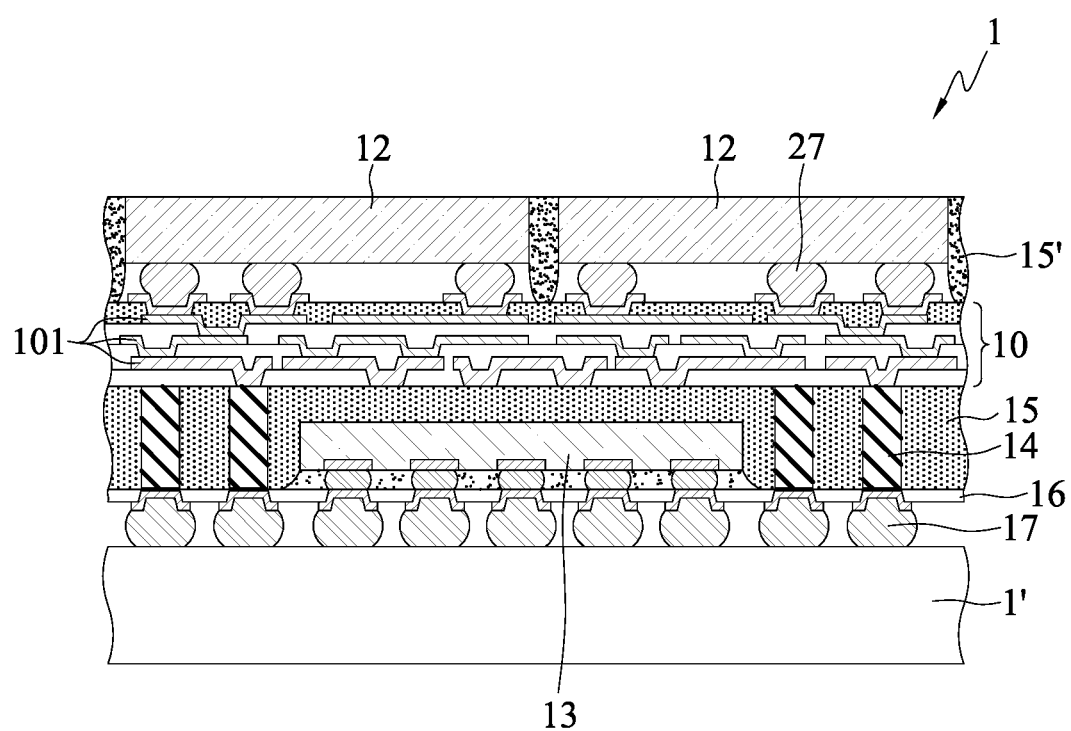
FIG. 1 is a schematic cross-sectional diagram depicting a conventional package structure in accordance with the present disclosure.

The implementations of present disclosure are illustrated using the following specific embodiments. One of ordinary skill in the art can readily appreciate other advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and the objectives achieved by the present disclosure, any modifications, changes or adjustments to the structures, ratio relationships or sizes, are to be construed as falling within the range covered by the technical contents disclosed herein. Meanwhile, terms such as "above," "first," "second," "a," "an," and the like, are for illustrative purposes, and are not meant to limit the scope in which the present disclosure can be implemented. Any variations or modifications made to their relative relationships, without changing the substantial technical content, are also to be considered as within the scope in which the present disclosure can be implemented.

FIG. 2A to FIG. 2G are schematic cross-sectional diagrams illustrating a manufacturing method of an electronic package 2 in accordance with a first embodiment of the present disclosure.

Figure 2A:
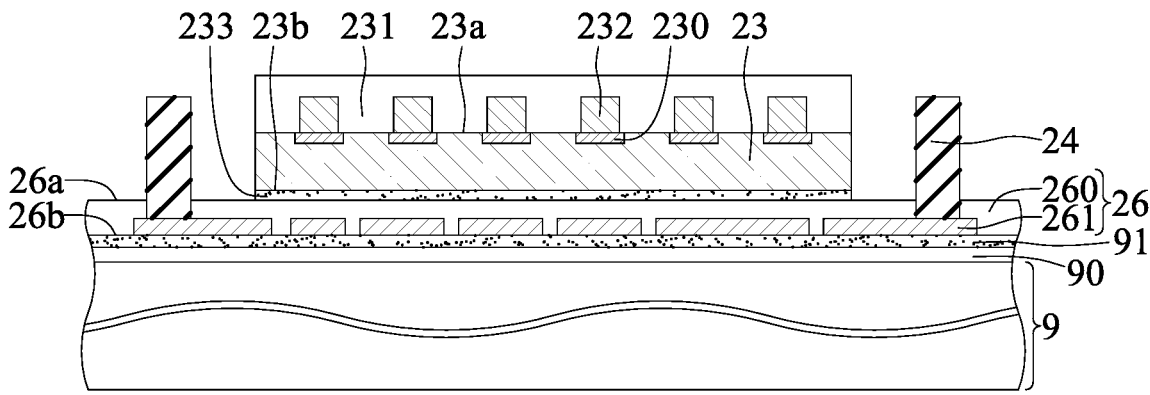

As shown in FIG. 2A, a wiring structure 26 is bonded onto a carrier 9. The wiring structure 26 includes a first side 26a and a second side 26b opposite to each other, and the wiring structure 26 is bonded onto the carrier 9 via the second side 26b. Next, a plurality of conductive structures 24 electrically connected with the wiring structure 26 are formed on the first side 26a of the wiring structure 26, and a functional electronic component 23 is disposed on the first side 26a of the wiring structure 26, wherein the functional electronic component 23 is bonded and electrically connected with a plurality of conductors 232.

The carrier 9 can be, for example, a circular board made of a semiconductor material with a release layer 90 and a bonding layer 91 coated sequentially thereon, such that the wiring structure 26 can be provided on the bonding layer 91.

The wiring structure 26 includes at least one dielectric layer 260 and a circuit layer 261 disposed on the dielectric layer 260, such as in the form of a redistribution layer (RDL).

In an embodiment, the circuit layer 261 can be formed using, for example, copper, and the dielectric layer 260 can be made of a dielectric material, such as polybenzoxazole (PBO), polyimide (PI), or prepreg (PP).

The functional electronic component 23 can be an active component, a passive component or a combination of both, wherein the active component is, for example, a semiconductor chip, and the passive component is, for example, a resistor, a capacitor or an inductor.

In an embodiment, the functional electronic component 23 is a semiconductor chip, which contains signal processing functions (i.e., the so-called functional chip), such as System on a Chip (SoC). For example, the functional electronic component 23 includes an active face 23a and a non-active face 23b opposite to each other. The non-active face 23b of the functional electronic component 23 is adhered onto the first side 26a of the wiring structure 26 via an adhesive 233. The active face 23a includes a plurality of electrode pads 230, such that the conductors 232 are formed on the electrode pads 230. An insulating layer 231 is formed on the active face 23a for covering the electrode pads 230 and the conductors 232. Alternatively, the conductors 232 can be exposed from the insulating layer 231.

Moreover, the conductors 232 can be, for example, spherical (e.g., solder balls), pillar-shaped (e.g., metal materials such as copper pillars, solder bumps, etc.), or stud-shaped formed by a wire bonding machine, and the present disclosure is not limited as such.

In addition, the functional electronic component 23 can also be provided using flip chip technology. For example, the active face 23a faces towards the wiring structure 26, and the electrode pads 230 are electrically connected with the circuit layer 261 of the wiring structure 26.

The conductive structures 24 are disposed on the circuit layer 261 and electrically connected with the circuit layer 261. In an embodiment, the conductive structures 24 are pillar-shaped, and can be made of metal materials (e.g., copper) or solder materials.

Figure 2B:
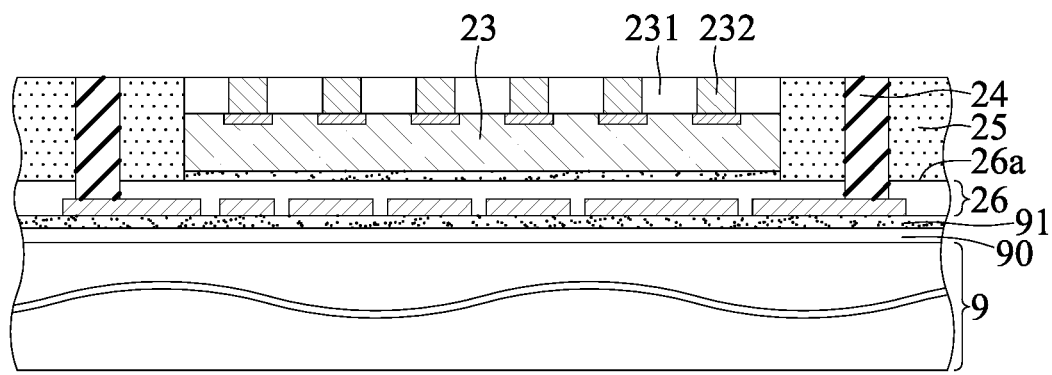

As shown in FIG. 2B, an encapsulation layer 25 is formed on the first side 26a of the wiring structure 26 to encapsulate the functional electronic component 23, the insulating layer 231 (or the conductors 232) and the conductive structures 24. Then, the upper surface of the encapsulation layer 25 is made to be flush with the upper surface of the insulating layer 231, the end surfaces of the conductive structures 24 and the end surfaces of the conductors 232 through a planarization process, so as to expose the upper surfaces of the insulating layer 231, the end surfaces of the conductive structures 24 and the end surfaces of the conductors 232 from the encapsulation layer 25.

In an embodiment, the encapsulation layer 25 can be made of an insulating material, such as PI, a dry film, an epoxy resin or a molding compound, and the present disclosure is not limited to these.

Furthermore, the encapsulation layer 25 can be formed on the first side 26a of the wiring structure 26 by lamination or molding.

In addition, the planarization process involves removing a portion of the conductive structures 24, a portion of the insulating layer 231 (depending on the needs, also a portion of the conductors 232) and a portion of the encapsulation layer 25 by grinding.

It can be appreciated that if the conductors 232 are already exposed from the insulating layer 231, then removing a portion of the insulating layer 231 will allow the conductors 232 to be exposed from the encapsulation layer 25 (depending on the needs, both a portion of the insulating layer 231 and a portion of the conductors 232 can be simultaneously removed to allow the conductors 232 to be exposed from the encapsulation layer 25).

Figure 2C:
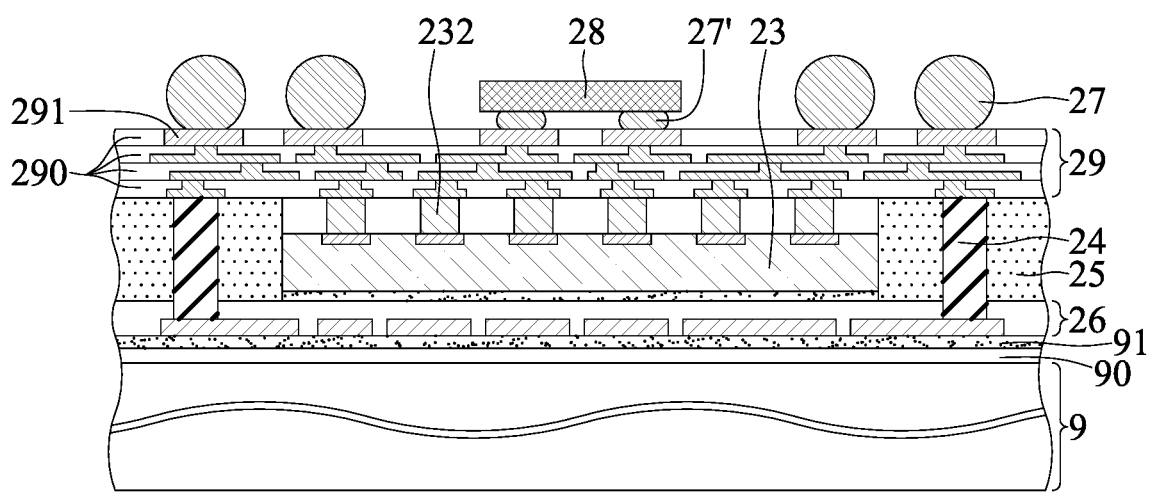

As shown in FIG. 2C, a wiring structure 29 is formed on the encapsulation layer 25, and the wiring structure 29 is electrically connected with the conductive structures 24 and the conductors 232, so the functional electronic component 23 can be electrically connected and grounded to the wiring structure 29 via the conductors 232.

In an embodiment, the wiring structure 29 includes a plurality of dielectric layers 290 and a plurality of circuit layers 291 disposed on the dielectric layers 290 (for example, RDLs), and the outermost dielectric layer 290 can be used as a solder resist layer. The outermost circuit layer 291 is exposed from the solder resist layer. Alternatively, the wiring structure 29 can only include a single dielectric layer 290 and a single circuit layer 291.

Moreover, the circuit layers 291 can be made of copper, and the dielectric layers 290 can be made of dielectric materials, such as PBO, PI, prepreg, or the like.

Furthermore, a plurality of conductive components 27 (e.g., solder balls) are formed on the outermost circuit layer 291 for subsequent connection with an electronic device (not shown), such as a circuit board. For example, an under bump metallurgy (UBM) can be formed on the outermost circuit layer 291 to facilitate bonding of the conductive components 27.

In addition, depending on the needs, at least one auxiliary electronic component 28 can be provided on the outermost circuit layer 291, and the auxiliary electronic component 28 is electrically connected with the circuit layers 291 via conductive components 27' (e.g., solder materials). For example, the auxiliary electronic component 28 can be an active component, a passive component or a combination of both, wherein the active component is, for example, a semiconductor chip, and the passive component is, for example, a resistor, a capacitor or an inductor.

Figure 2D:
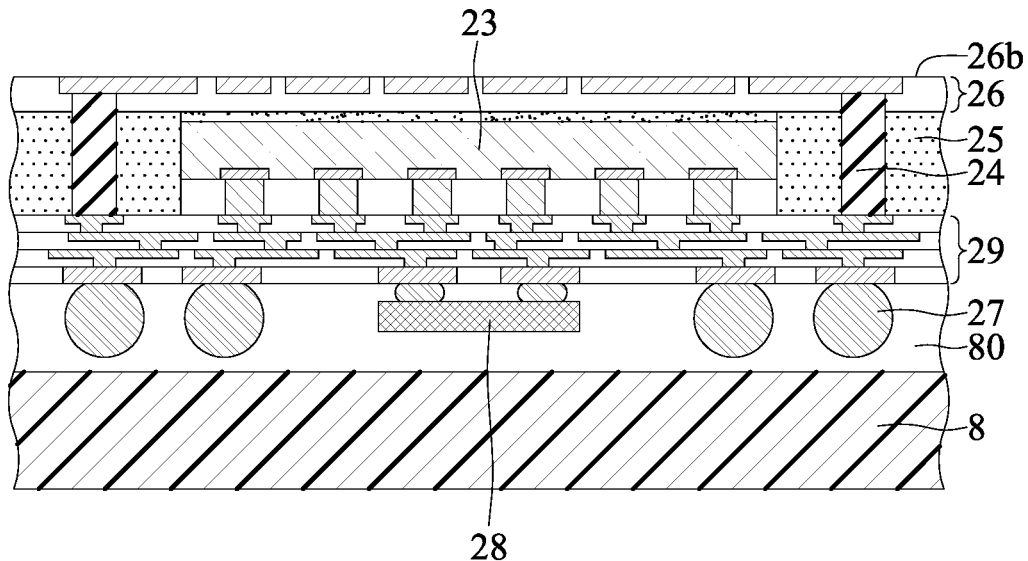

As shown in FIG. 2D, the carrier 9 and the release layer 90 thereon are removed, and the bonding layer 91 is removed depending on the needs, so as to expose the second side 26b of the wiring structure 26. Then, the entire structure is flipped over.

In an embodiment, the conductive components 27 and the auxiliary electronic component 28 are disposed on a protective film 80 of a support structure 8 to facilitate flipping over.

Figure 2E:
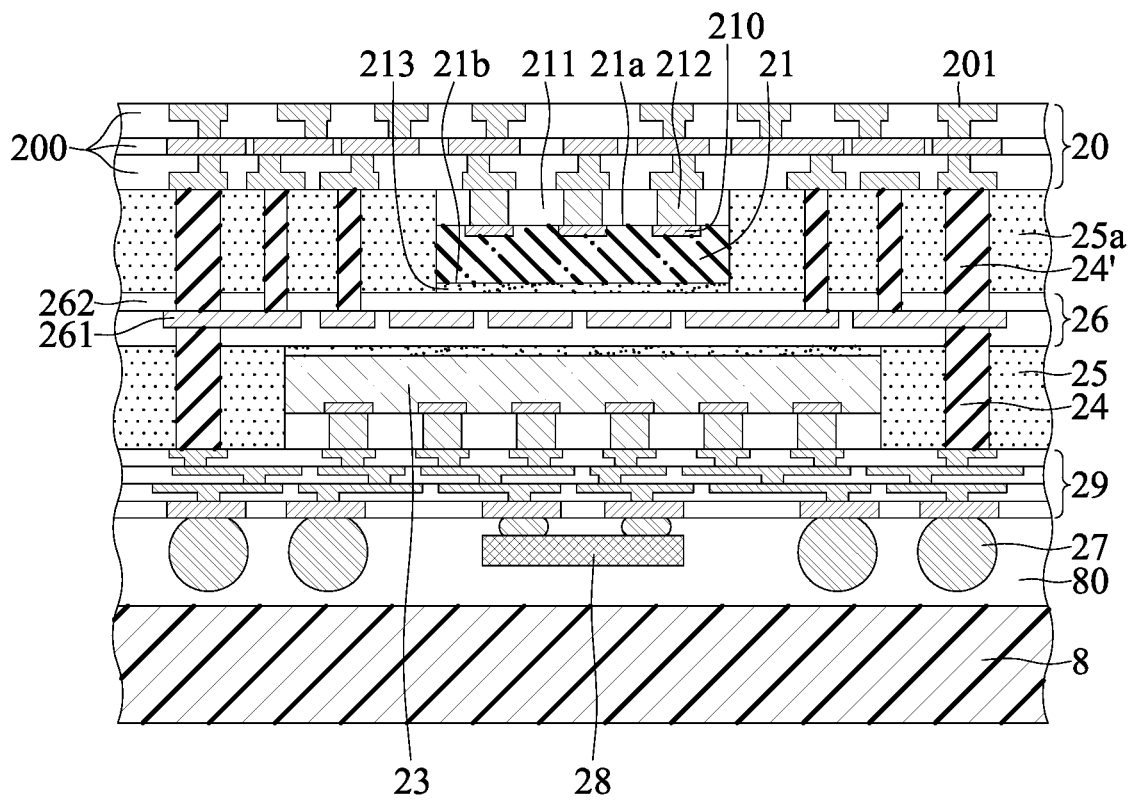

As shown in FIG. 2E, similar to the process described with respect to FIGS. 2A to 2C above, a first electronic component 21 is disposed on the second side 26b of the wiring structure 26, and a plurality of conductive structures 24' are formed. Then, the first electronic component 21 and the conductive structures 24' are encapsulated by an encapsulant 25a. Next, a circuit structure 20 is formed on the encapsulant 25a. The circuit structure 20 is electrically connected with the conductive structures 24' and the first electronic component 21.

In an embodiment, a dielectric layer 262 can be formed on the second side 26b of the wiring structure 26 to facilitate the provision of the first electronic component 21 and the formation of the conductive structures 24'.

The first electronic component 21 can be an active component, a passive component or a combination of both, wherein the active component is, for example, a semiconductor chip, and the passive component is, for example, a resistor, a capacitor or an inductor.

In an embodiment, the first electronic component 21 is a semiconductor chip without signal processing functions (i.e., a so-called non-functional chip), and is merely used as an electrical conduction path (or a bridge chip). For example, the first electronic component 21 includes an active face 21a and a non-active face 21b opposite to each other. The non-active face 21b of the first electronic component 21 is adhered onto the dielectric layer 262 of the second side 26b of the wiring structure 26 via an adhesive 213. The active face 21a includes a plurality of electrode pads 210, such that the conductors 212 are formed on the electrode pads 210. Depending on the needs, an insulating layer 211 can be formed on the active face 21a for covering the electrode pads 210 and the conductors 212.

Moreover, the conductors 212 can be, for example, spherical (e.g., solder balls), pillar-shaped (e.g., metal materials such as copper pillars, solder bumps, etc.), or stud-shaped formed by a wire bonding machine, and the present disclosure is not limited as such.

Figure 6A:
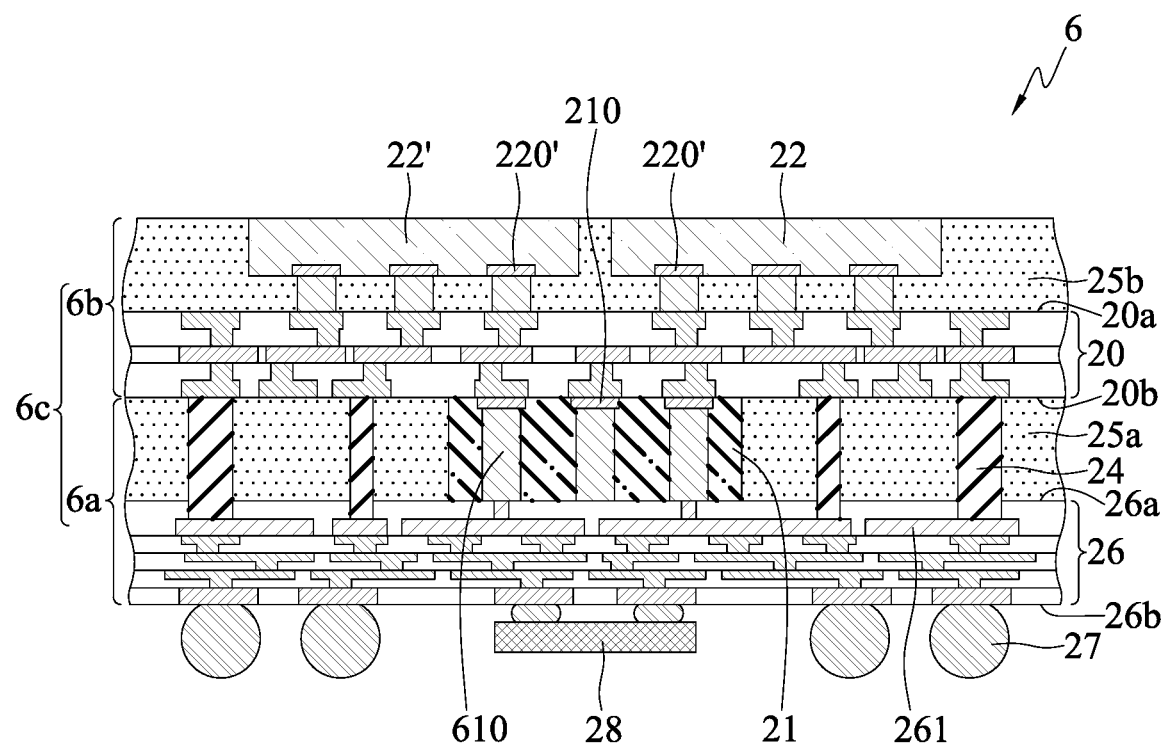
FIG. 6A and FIG. 6B are schematic cross-sectional diagrams illustrating a manufacturing method of an electronic package in accordance with a fifth embodiment of the present disclosure.

Furthermore, there is no need to arrange circuits on the area of the second side 26b of the wiring structure 26 corresponding to where the first electronic component 21 is located, that is, there is only the dielectric layer 262. It can be appreciated that if the first electronic component 21 is a chip with a through-silicon vias (TSVs) 610 (as shown in FIG. 6A), then the TSVs 610 interconnects the active face 21a with the non-active face 21b. As such, the circuit layer 261 needs to be arranged on the area of the second side 26b of the wiring structure 26 corresponding to where the first electronic component 21 is located.

The conductive structures 24' are disposed on the circuit layer 261 and electrically connected with the circuit layer 261. The conductive structures 24' are pillar-shaped and can be made of metal materials (e.g., copper) or solder materials.

In an embodiment, the encapsulant 25a can be made of an insulating material, such as PI, a dry film, an epoxy resin or a molding compound, and the present disclosure is not limited to these. For example, the encapsulant 25a can be formed on the second side 26b of the wiring structure 26 by lamination or molding. It can be appreciated that the encapsulant 25a and the encapsulation layer 25 can be made of the same material or different materials.

In an embodiment, the upper surface of the encapsulant 25a is made to be flush with the upper surface of the insulating layer 211, the end surfaces of the conductive structures 24' and the end surfaces of the conductors 212 through a planarization process, so as to expose the upper surfaces of the insulating layer 211, the end surfaces of the conductive structures 24' and the end surfaces of the conductors 212 from the encapsulant 25a. For example, the planarization process involves removing a portion of the conductive structures 24', a portion of the insulating layer 211 (depending on the needs, also a portion of the conductors 212) and a portion of the encapsulant 25a by grinding. It can be appreciated that if the conductors 212 are already exposed from the insulating layer 211, then removing a portion of the insulating layer 211 will allow the conductors 212 to be exposed from the encapsulant 25a (depending on the needs, both a portion of the insulating layer 211 and a portion of the conductors 212 can be simultaneously removed to allow the conductors 212 to be exposed from the encapsulant 25a).

The circuit structure 20 includes a plurality of dielectric layers 200 and a plurality of circuit layers 201 disposed on the dielectric layers 200 (for example, RDLs), and the outermost dielectric layer 200 can be used as a solder resist layer. The outermost circuit layer 201 is exposed from the solder resist layer. For example, the circuit layers 201 can be made of copper, and the dielectric layers 200 can be made of dielectric materials, such as PBO, PI, prepreg, or the like. It can be appreciated that the circuit structure 20 also can include only a single dielectric layer 200 and a single circuit layer 201.

Figures 1, 2F:
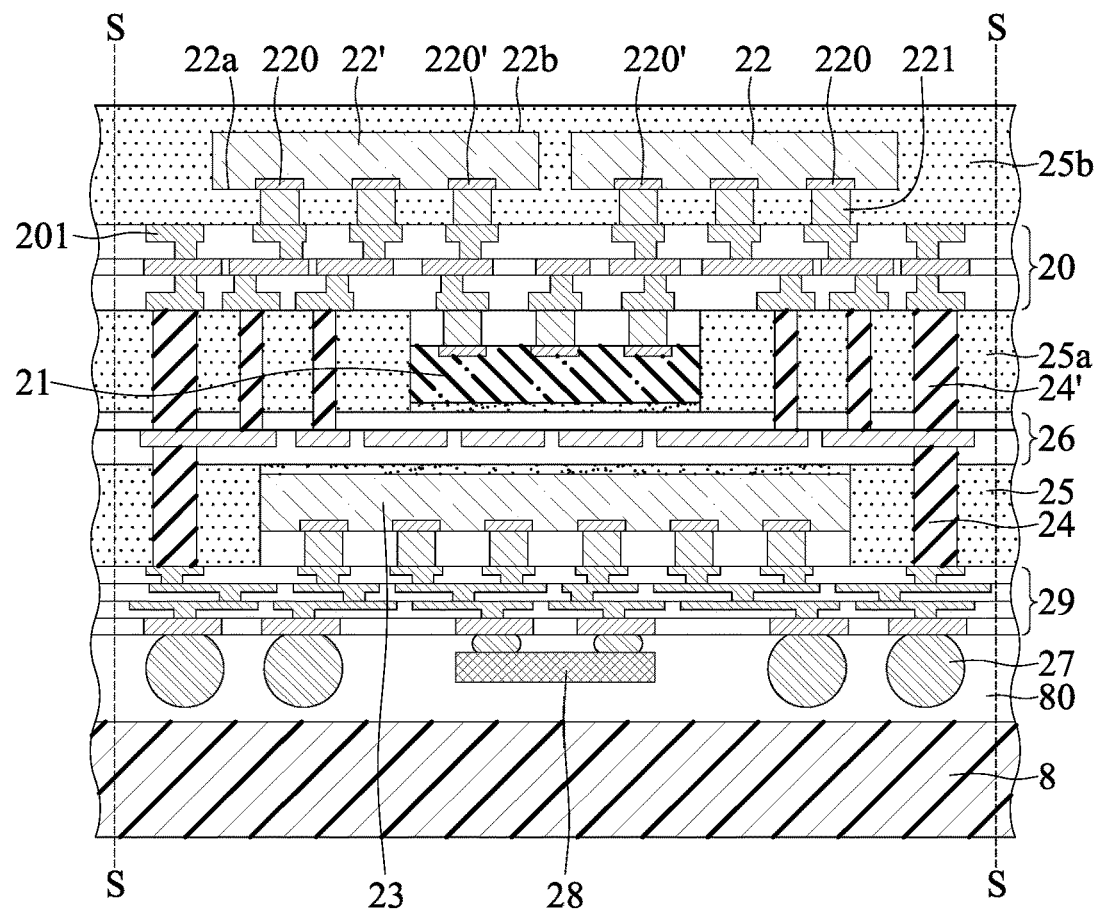

As shown in FIG. 2F-1, a plurality of second electronic components 22, 22' are disposed on the circuit structure 20, and the second electronic components 22, 22' are then encapsulated by an encapsulant 25b.

The second electronic component 22, 22' can be an active component, a passive component or a combination of both, wherein the active component is, for example, a semiconductor chip, and the passive component is, for example, a resistor, a capacitor or an inductor.

In an embodiment, the second electronic component 22, 22' is a semiconductor chip, such as a functional chip, for example, a dynamic random access memory (DRAM), a graphics processing unit (GPU), a high bandwidth memory (HBM), an application specific integrated circuit (ASIC) or the like, and the present disclosure is not limited as such. For example, each second electronic component 22, 22' includes an active face 22a and a non-active face 22b opposite to each other, and each active face 22a includes a plurality of electrode pads 220, 220'. The second electronic component 22, 22' is electrically connected with the circuit layers 201 of the circuit structure 20 in a flip-chip manner via a plurality of conductive bumps 221, such as solder bumps, copper bumps, or the like. The encapsulant 25b can simultaneously encapsulate the second electronic component 22, 22' and the conductive bumps 221.

Moreover, some electrode pads 220' of at least two of the second electronic components 22, 22' are electrically connected with one another via the circuit structure 20 and the first electronic component 21, wherein the first electronic component 21 achieves the purpose of electrical bridging. For example, the quantity of the first electronic component 21 can be adjusted according to the second electronic components 22, 22' that require electrical bridging, such as those shown in FIGS. 2F-3 to 2F-5.

In addition, the first electronic component 21 covers a portion of the second electronic components 22, 22' which it electrically bridges, such that the location of the first electronic component 21 with respect to the second electronic components 22, 22' can overlap on densely distributed regions P (shown as hatched areas in FIG. 2F-2) of the electrode pads 220' of the second electronic components 22, 22'. For example, on the area of the second electronic components 22, 22' where there is a larger amount and higher density of electrode pads 220, 220' that are being used as contacts (I/Os), the line width/line spacing (L/S) of the wiring specifications of the first electronic component 21 is at most two microns (that is, L/S≤2/2 μm), so that the second electronic components 22, 22' are provided with a plurality of electrode pads 220' electrically connected with the first electronic component 21 on the densely distributed region P.

Figures 2, 2F:
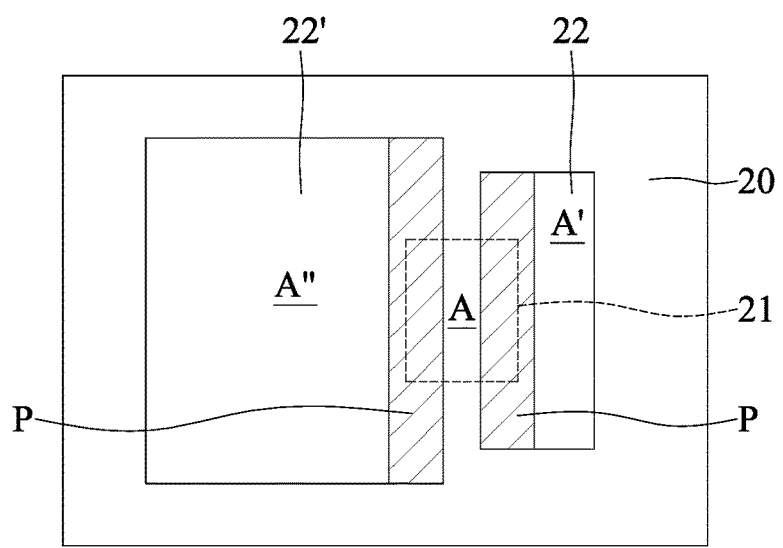
Figures 2, 2F, 3:
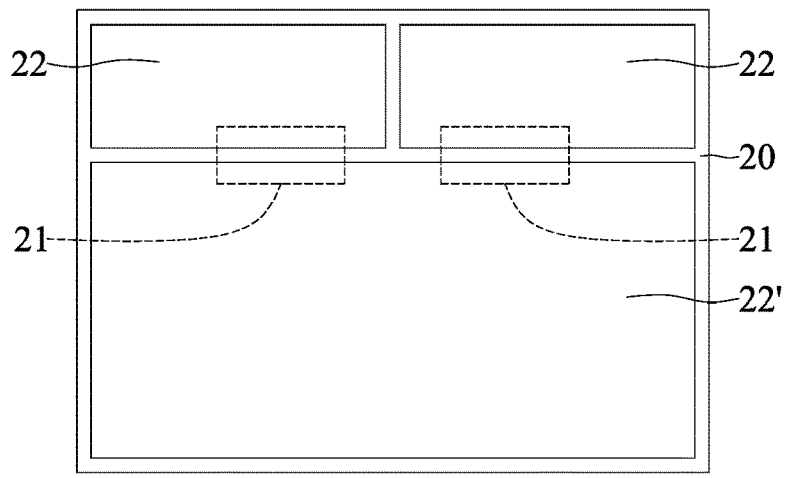
Figures 2, 2F, 3, 4:
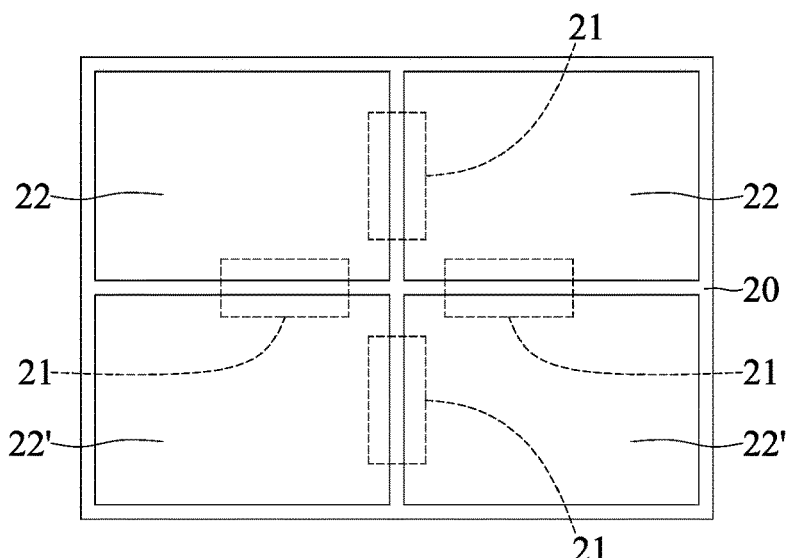
Figures 2, 2F, 3, 4, 5:
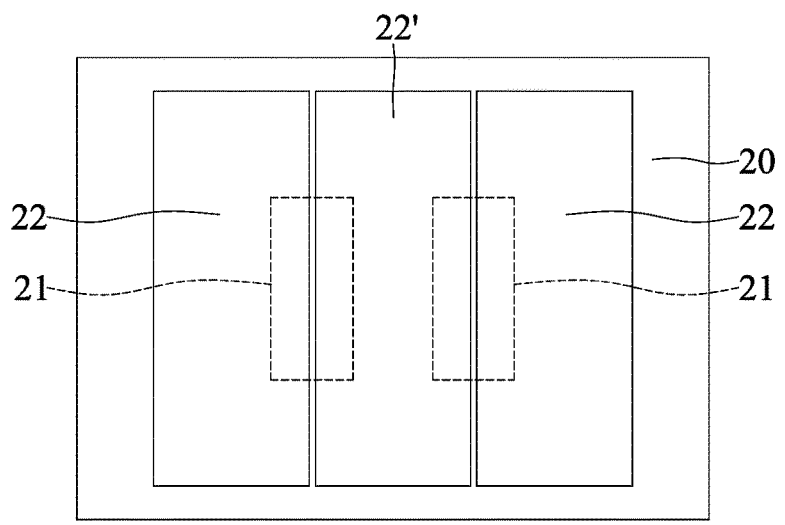

In addition, a vertically projected area A (shown as a dashed boundary in FIG. 2F-2) of the top surface (i.e., the active face 21a or the non-active face 21b) of the first electronic component 21 is smaller than vertically projected areas A', A'' of the top surfaces (i.e., the active faces 22a or the non-active faces 22b) of the second electronic components 22, 22' which it electrically bridges (i.e., A<A', and A<A''). As shown in FIG. 2F-2, for example, the vertically projected area A of the top surface of the first electronic component 21 is 0.01 to 0.5 times of the vertically projected areas A', A'' of the top surfaces of the second electronic components 22, 22' (that is, A=0.01A'~0.5A', and A=0.01A''~0.5A'').

Therefore, the first electronic component 21 is not a functional chip and its dimensions (e.g., length, width and height) are adjustable, so the first electronic component 21 has no specific dimensions, and can be adjusted depending on the needs under the above constraints (that is, A=0.01A'~0.5A', and A=0.01A''~0.5A''), thereby improving product reliability. For example, by increasing the volume of the first electronic component 21, usage of the encapsulant 25a can be reduced to prevent warpage of the overall structure or other issues encountered during the packaging process.

The encapsulant 25b can be an insulating material, such as PI, a dry film, a molding compound (e.g., an epoxy resin), and can be formed by lamination or molding on the circuit structure 20. It can be appreciated that the encapsulant 25b and the encapsulation layer 25 can be made of the same material or different materials.

In an embodiment, an underfill (not shown) can first be formed between the second electronic components 22, 22' and the circuit structure 20 to cover the conductive bumps 221. Then, the encapsulant 25b is formed to cover the underfill and the second electronic components 22, 22'.

Figure 2G:
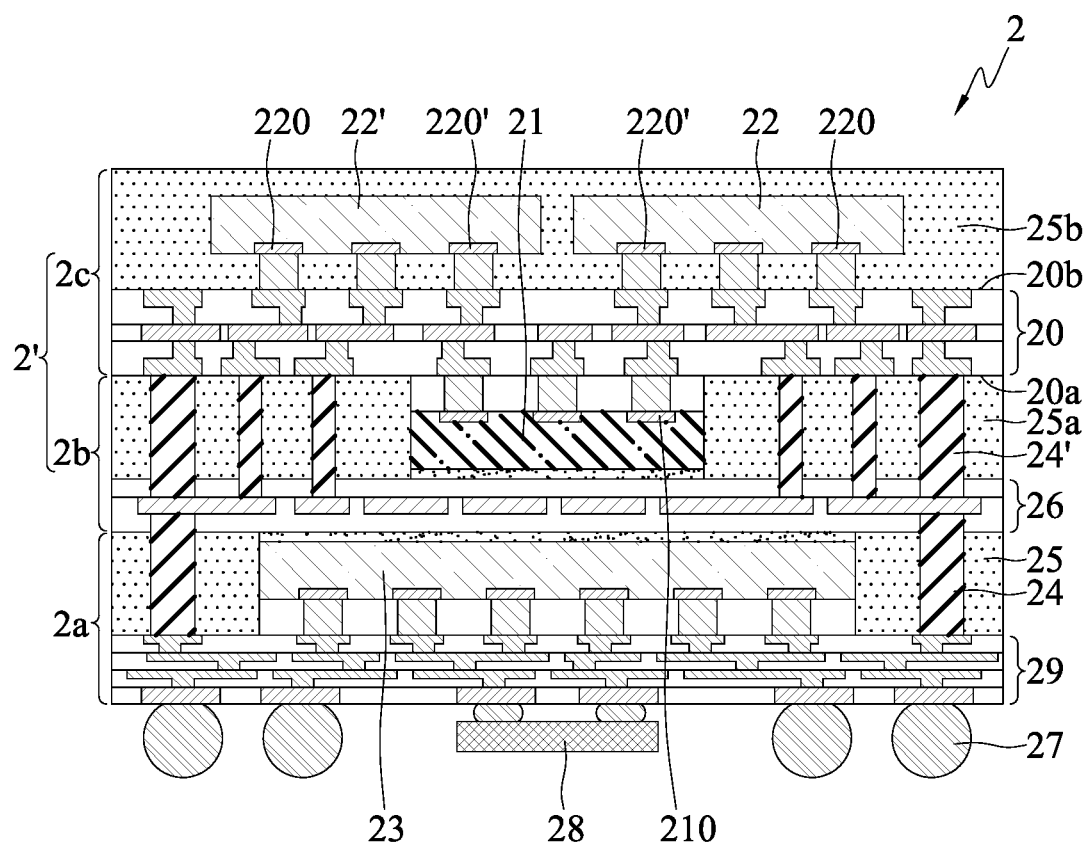

As shown in FIG. 2G, a singulation process is performed along cutting paths S shown in FIG. 2F-1, and the support structure 8 as well as the protective film 80 thereon are removed, thereby obtaining the electronic package 2.

In an embodiment, the electronic package 2 is defined with a first package structure 2a, a second package structure 2b and a third package structure 2c.

The first package structure 2a includes the wiring structure 29, the functional electronic component 23, the conductive structures 24 and the encapsulation layer 25.

The second package structure 2b includes the wiring structure 26, the first electronic component 21, the conductive structures 24' and the encapsulant 25a.

The third package structure 2c includes the circuit structure 20, the second electronic components 22, 22' and the encapsulant 25b.

In an embodiment, the second package structure 2b and the third package structure 2c of the electronic package 2 are further defined as an electronic package body 2' with an electrical bridging structure.

FIGS. 3A to 3D are schematic cross-sectional diagrams illustrating a manufacturing method of an electronic package 3 in accordance with a second embodiment of the present disclosure. This embodiment is different from the first embodiment in the order and the manner in which the various electronic components are provided. The rest of the process is generally the same and thus will not be repeated.

Figure 3A:
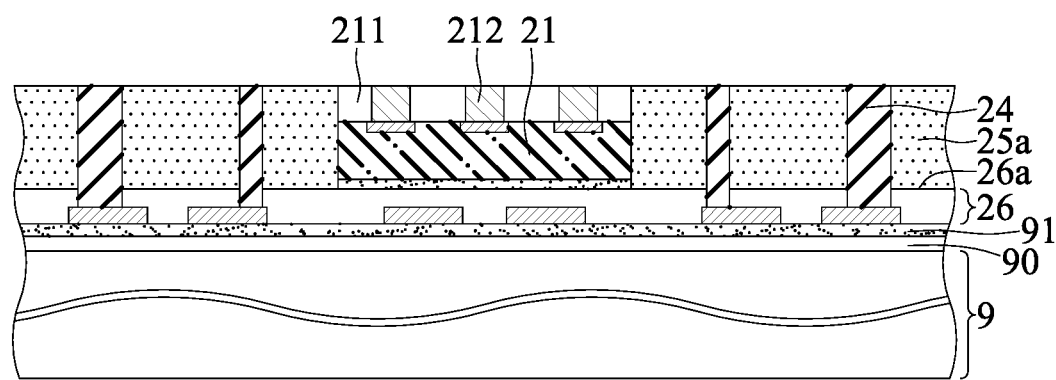
FIG. 3A to FIG. 3D are schematic cross-sectional diagrams illustrating a manufacturing method of an electronic package in accordance with a second embodiment of the present disclosure.

As shown in FIG. 3A, similar to the steps described with respect to FIGS. 2A to 2B, a wiring structure 26 is formed on a carrier 9, and a plurality of conductive structures 24 are formed on and electrically connected with the wiring structure 26, and a first electronic component 21 having a plurality of conductors 212 and an insulating layer 211 is disposed on the first side 26a of the wiring structure 26. Then, an encapsulant 25a is formed on the first side 26a of the wiring structure 26 to encapsulate the first electronic component 21, the conductors 212 and the conductive structures 24. Next, with a planarization process, the upper surface of the encapsulant 25a is made to be flush with the top surface of the insulating layer 211, the end surfaces of the conductive structures 24 and the end surfaces of the conductors 212, such that the top surface of the insulating layer 211, the end surfaces of the conductive structures 24 and the end surfaces of the conductors 212 are exposed from the encapsulant 25a.

Figure 3B:
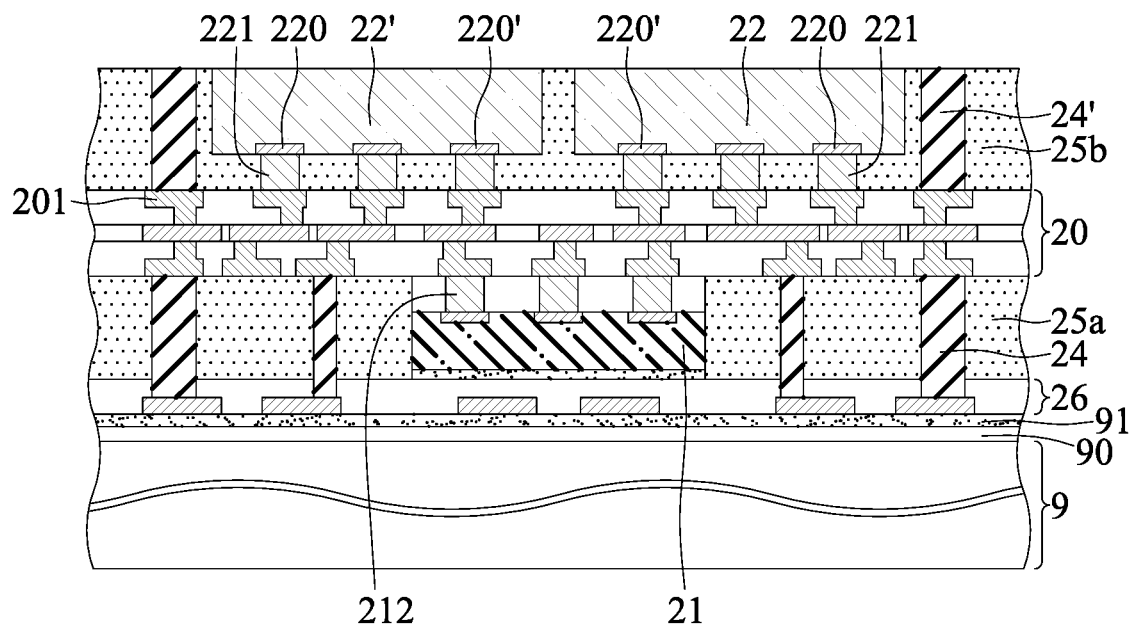

As shown in FIG. 3B, a circuit structure 20 is formed on the encapsulant 25a, and the circuit structure 20 is electrically connected with the conductive structures 24 and the conductors 212, so that the first electronic component 21 can be electrically connected and grounded to the circuit structure 20 via the conductors 212. Thereafter, a plurality of second electronic components 22, 22' are disposed and a plurality of conductive structures 24' are formed on the circuit structure 20. The second electronic components 22, 22' and the conductive structures 24' are then covered by an encapsulant 25b.

In an embodiment, the second electronic components 22, 22' are electrically connected with the circuit layers 201 of the circuit structure 20 in a flip-chip manner via a plurality of conductive bumps 221, such as solder bumps, copper bumps, or the like. The encapsulant 25b can simultaneously encapsulate the second electronic components 22, 22' and the conductive bumps 221. It can be appreciated that an underfill (not shown) can first be formed between the second electronic components 22, 22' and the circuit structure 20 to cover the conductive bumps 221. Then, the encapsulant 25b is formed to cover the underfill and the second electronic components 22, 22'.

Moreover, some electrode pads 220' of at least two of the second electronic components 22, 22' are electrically connected with one another via the circuit structure 20 and the first electronic component 21, wherein the first electronic component 21 achieves the purpose of electrical bridging.

In addition, the location of the first electronic component 21 with respect to the second electronic components 22, 22' can correspond to densely distributed regions P of the electrode pads 220' of the second electronic components 22, 22' (as shown in FIG. 2F-2).

In addition, a vertically projected area A of the top surface of the first electronic component 21 is smaller than vertically projected areas A', A" of the top surfaces of the second electronic components 22, 22' which it electrically bridges, as shown in FIG. 2F-2.

Furthermore, the size of the first electronic component 21 can be adjusted, thereby improving product reliability.

Figure 3C:
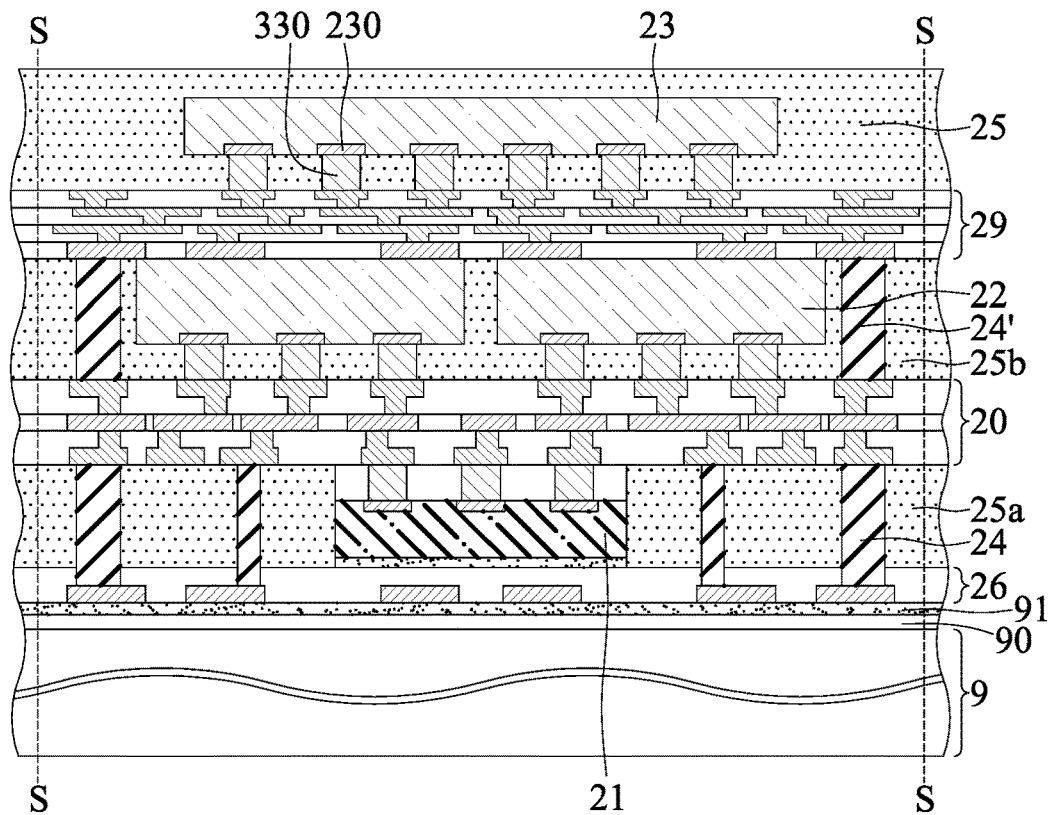

As shown in FIG. 3C, a wiring structure 29 is formed on the encapsulant 25b, and the wiring structure 29 is electrically connected with the conductive structures 24'. Then, at least one functional electronic component 23 is disposed on the wiring structure 29 and then encapsulated by an encapsulation layer 25.

In an embodiment, the electrode pads 230 of the functional electronic component 23 are electrically connected with the RDLs 291 of the wiring structure 29 in a flip-chip manner via a plurality of conductive bumps 330, such as solder or copper bumps or the like, and the encapsulation layer 25 can simultaneously encapsulate the functional electronic component 23 and the conductive bumps 330. It can be appreciated that an underfill (not shown) can first be formed between the functional electronic component 23 and the wiring structure 29 to cover the conductive bumps 330. Thereafter, the encapsulation layer 25 is formed to cover the underfill and the functional electronic component 23.

Figure 3D:
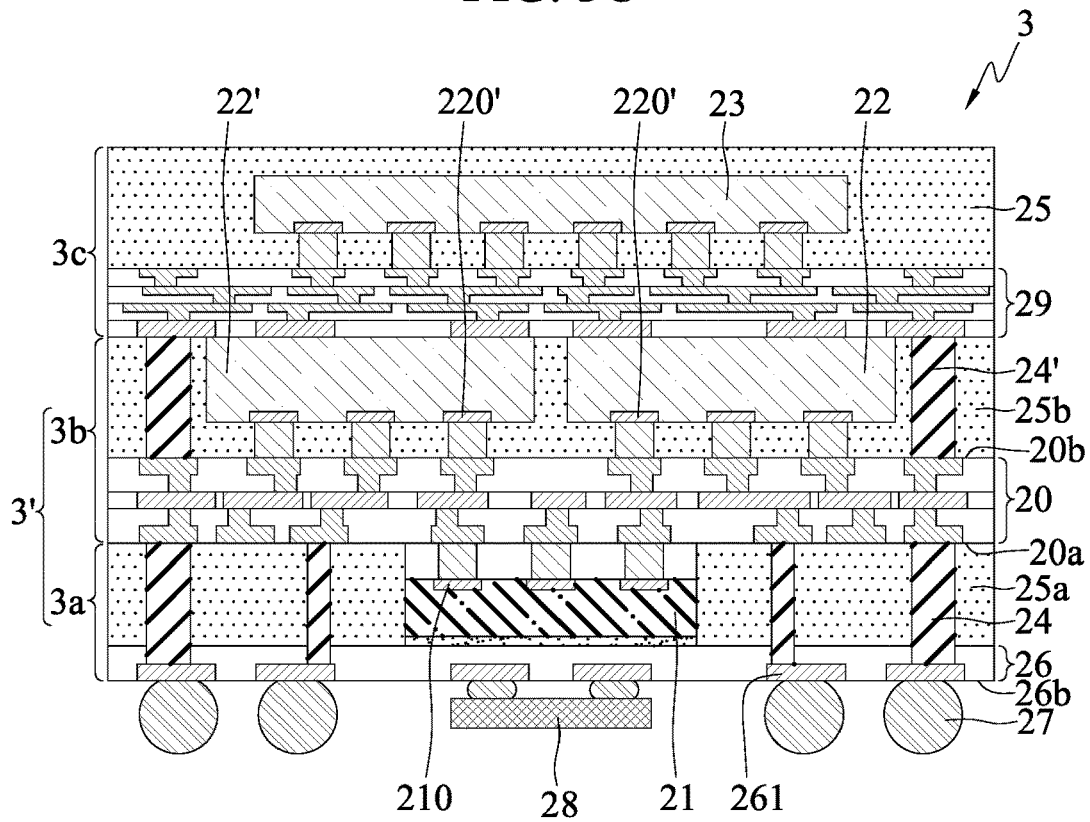

As shown in FIG. 3D, a singulation process is performed along cutting paths S shown in FIG. 3C, and the carrier 9 and the release layer 90 thereon are removed, and the bonding layer 91 can also be removed depending on the needs. As such, the second side 26b of the wiring structure 26 is exposed, thereby forming the electronic package 3.

In an embodiment, a plurality of conductive components 27 (e.g., solder balls) that are electrically connected with the circuit layer 261 of the wiring structure 26 are formed on the second side 26b of the wiring structure 26. Depending on the needs, at least one auxiliary electronic component 28 can be provided on the second side 26b of the wiring structure 26 and electrically connected with the circuit layer 261.

Moreover, the electronic package 3 is defined with a first package structure 3a, a second package structure 3b and a third package structure 3c.

The first package structure 3a includes the wiring structure 26, the first electronic component 21, the conductive structures 24 and the encapsulant 25a.

The second package structure 3b includes the circuit structure 20, the second electronic components 22, 22', the conductive structures 24' and the encapsulant 25b.

The third package structure 3c includes the wiring structure 29, the functional electronic component 23 and the encapsulation layer 25.

In an embodiment, the first package structure 3a and the second package structure 3b of the electronic package 3 are further defined as an electronic package body 3' with an electrical bridging structure.

FIG. 4A to FIG. 4D are schematic cross-sectional diagrams illustrating a manufacturing method of an electronic package 4 in accordance with a third embodiment of the present disclosure. This embodiment is different from the previous embodiments in the order and the manner in which the various electronic components are provided. The rest of the process is generally the same and thus will not be repeated.

Figure 4A:
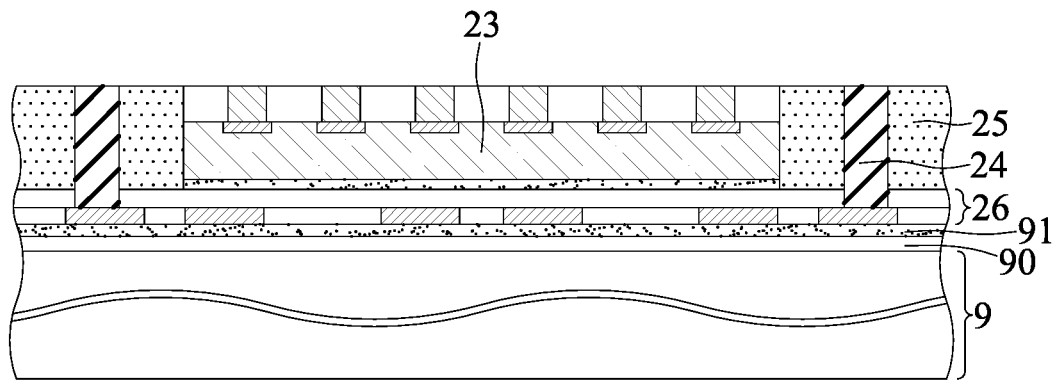
FIG. 4A to FIG. 4D are schematic cross-sectional diagrams illustrating a manufacturing method of an electronic package in accordance with a third embodiment of the present disclosure.

FIG. 4A shows the process similar to that shown in FIGS. 2A to 2B.

Figure 4B:
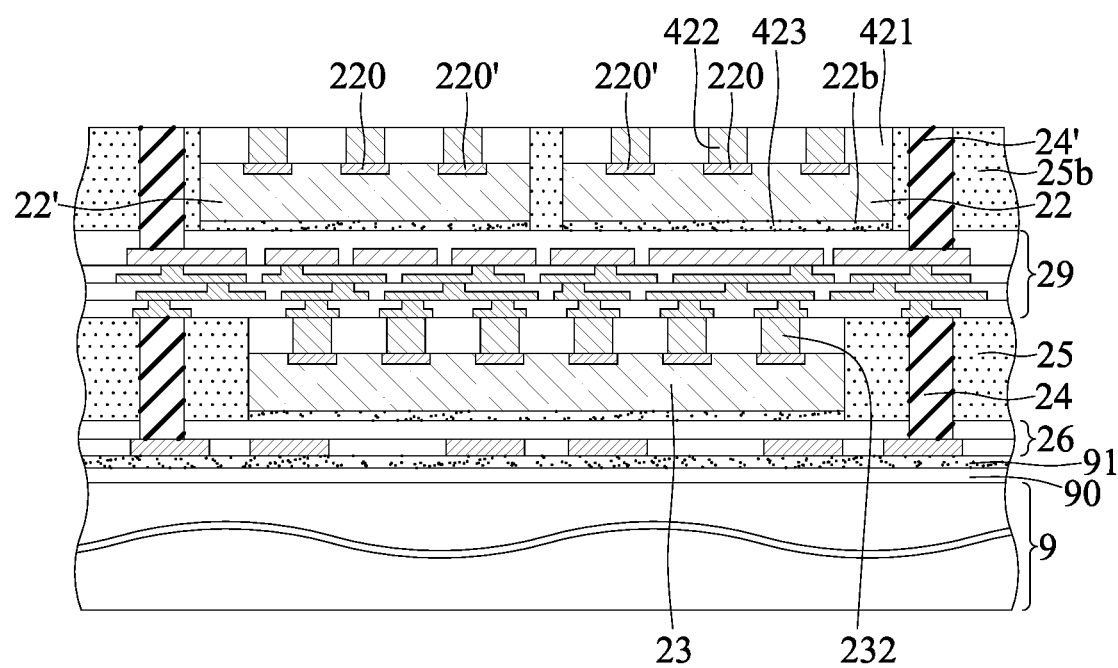

As shown in FIG. 4B, a wiring structure 29 is formed on the encapsulation layer 25, and the wiring structure 29 is electrically connected with the conductive structures 24 and the conductors 232, such that the functional electronic component 23 can be electrically connected and grounded to the wiring structure 29 via the conductors 232. Next, a plurality of second electronic components 22, 22' are disposed and a plurality of conductive structures 24' are formed on the wiring structure 29. The second electronic components 22, 22' and the conductive structures 24' are then covered by an encapsulant 25b.

In an embodiment, the non-active faces 22b of the second electronic components 22, 22' are adhered onto the wiring structure 29 by adhesives 423. Conductors 422 are formed on the electrode pads 220, 220' of the second electronic components 22, 22'. Depending on the needs, insulating layers 421 can be formed on the active faces 22a to cover the electrode pads 220, 220' and the conductors 422, wherein the conductors 422 can be, for example, spherical (e.g., solder balls), pillar-shaped (e.g., metal materials such as copper pillars, solder bumps, etc.), or stud-shaped formed by a wire bonding machine, and the present disclosure is not limited as such.

Figure 4C:
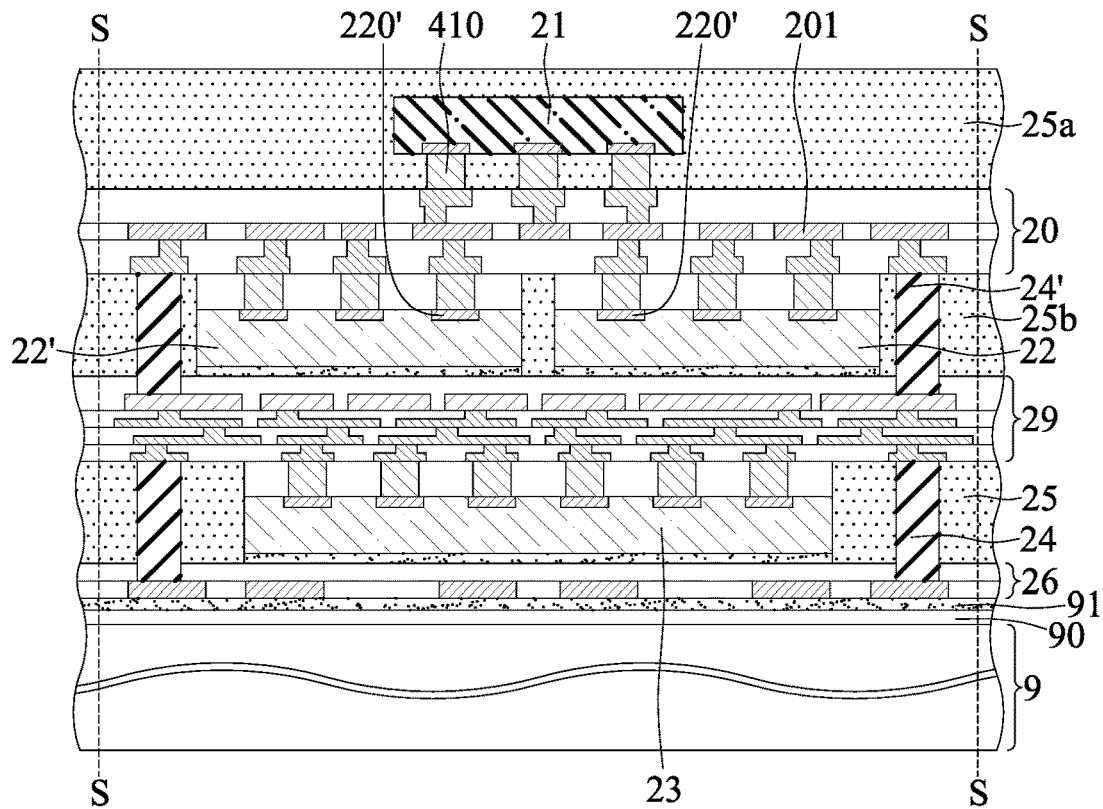

As shown in FIG. 4C, a circuit structure 20 is formed on the encapsulant 25b, and the circuit structure 20 is electrically connected with the conductive structures 24' and the second electronic components 22, 22'. Next, a first electronic component 21 is disposed on the circuit structure 20, and then the first electronic component 21 is encapsulated by an encapsulant 25a.

In an embodiment, the first electronic component 21 is electrically connected to the circuit layers 201 of the circuit structure 20 in a flip-chip manner via a plurality of conductive bumps 410, such as solder bumps, copper bumps, or the like. The encapsulant 25a can simultaneously encapsulate both the first electronic component 21 and the conductive bumps 410. It can be appreciated that an underfill (not shown) can first be formed between the first electronic component 21 and the circuit structure 20 to cover the conductive bumps 410. Then, the encapsulant 25a is formed to cover the underfill and the first electronic component 21.

Moreover, some electrode pads 220' of at least two of the second electronic components 22, 22' are electrically connected with one another via the circuit structure 20 and the first electronic component 21, wherein the first electronic component 21 achieves the purpose of electrical bridging.

In addition, the location of the first electronic component 21 with respect to the second electronic components 22, 22' can correspond to the densely distributed regions P of the electrode pads 220' of the second electronic components 22, 22' (as shown in FIG. 2F-2).

Moreover, a vertically projected area A of the top surface of the first electronic component 21 is smaller than vertically projected areas A', A" of the top surfaces of the second electronic components 22, 22' which it electrically bridges, as shown in FIG. 2F-2.

Furthermore, the size of the first electronic component 21 can be adjusted, thereby improving product reliability.

Figure 4D:
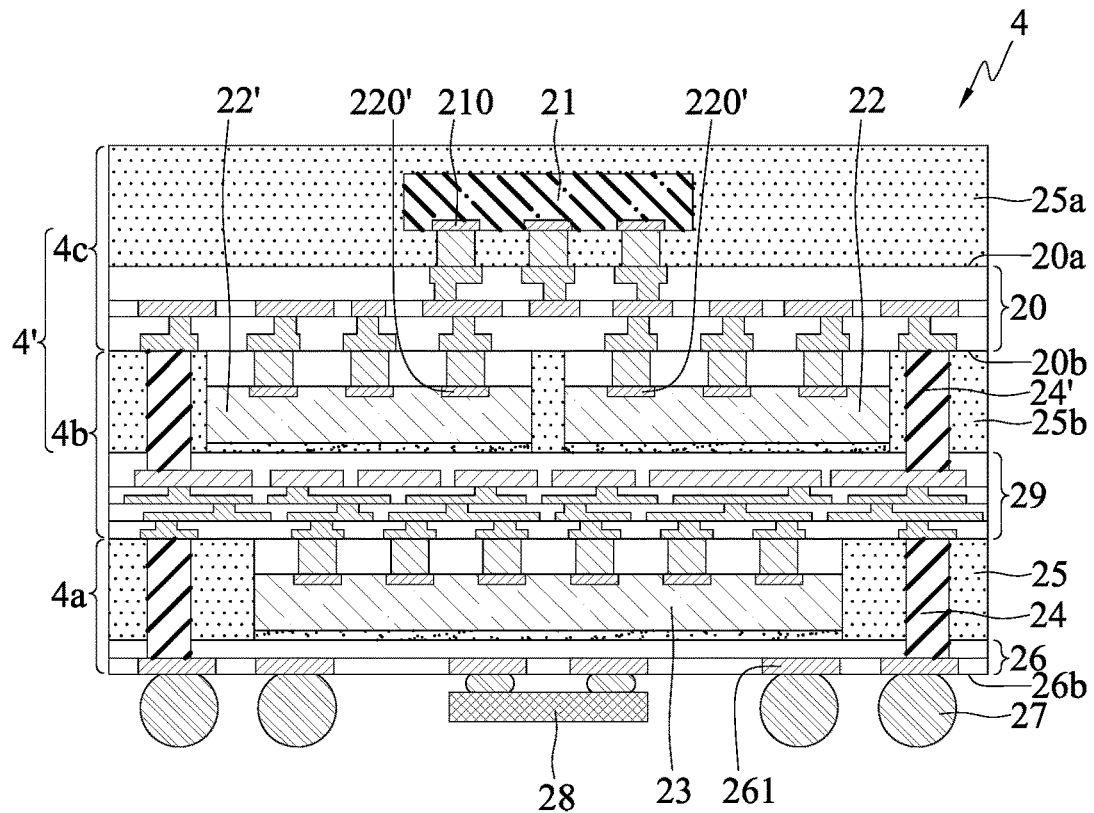

As shown in FIG. 4D, a singulation process is performed along cutting paths S shown in FIG. 4C, and the carrier 9 and the release layer 90 thereon are removed, and the bonding layer 91 can also be removed depending on the needs. As such, the second side 26b of the wiring structure 26 is exposed, thereby forming the electronic package 4.

In an embodiment, a plurality of conductive components 27 (e.g., solder balls) that are electrically connected with the circuit layer 261 are formed on the second side 26b of the wiring structure 26. Depending on the needs, at least one auxiliary electronic component 28 can be provided on the second side 26b of the wiring structure 26 and electrically connected with the circuit layer 261.

Moreover, the electronic package 4 is defined with a first package structure 4a, a second package structure 4b and a third package structure 4c.

The first package structure 4a includes the wiring structure 26, the functional electronic component 23, the conductive structures 24 and the encapsulation layer 25.

The second package structure 4b includes the wiring structure 29, the second electronic components 22, 22', the conductive structures 24' and the encapsulant 25b.

The third package structure 4c includes the circuit structure 20, the first electronic component 21 and the encapsulant 25a.

In an embodiment, the second package structure 4b and the third package structure 4c of the electronic package 4 are further defined as an electronic package body 4' with an electrical bridging structure.

FIG. 5A to FIG. 5D are schematic cross-sectional diagrams illustrating a manufacturing method of an electronic package 5 in accordance with a fourth embodiment of the present disclosure. This embodiment is different from the previous embodiments in the order and the manner in which the various electronic components are provided. The rest of the process is generally the same and thus will not be repeated.

Figure 5A:
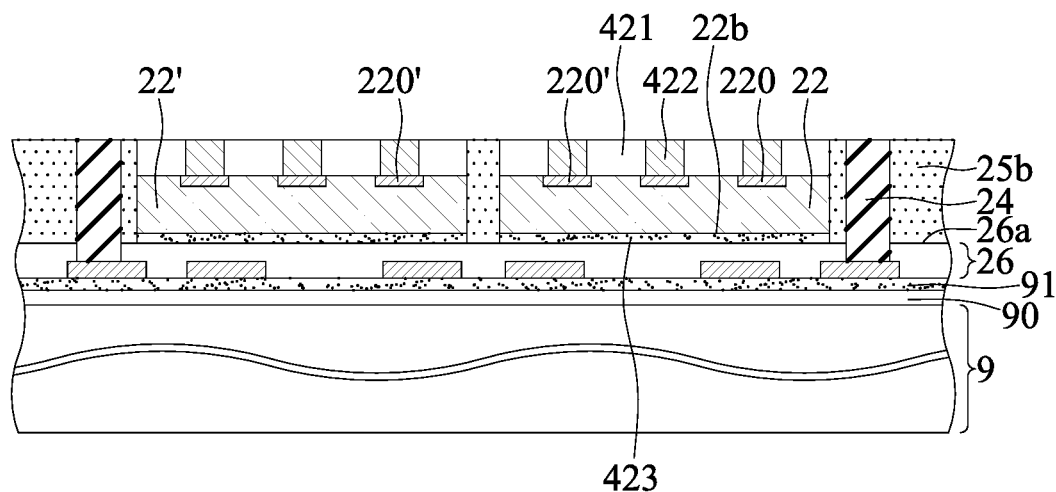
FIG. 5A to FIG. 5D are schematic cross-sectional diagrams illustrating a manufacturing method of an electronic package in accordance with a fourth embodiment of the present disclosure.

As shown in FIG. 5A, similar to the steps described with respect to FIGS. 2A to 2B, a plurality of conductive structures 24 electrically connected with the circuit layer 261 are formed on the first side 26a of the wiring structure 26, and second electronic components 22, 22' having conductors 422 are disposed on the first side 26a of the wiring structure 26. Then, an encapsulant 25b is formed on the first side 26a of the wiring structure 26 to cover the second electronic components 22, 22', the conductors 422 and the conductive structures 24.

In an embodiment, the non-active faces 22b of the second electronic components 22, 22' are adhered onto the first side 26a of the wiring structure 26 by adhesives 423. Conductors 422 are formed on the electrode pads 220, 220' of the second electronic components 22, 22'. Depending on the needs, insulating layers 421 can be formed on the active faces 22a to cover the electrode pads 220, 220' and the conductors 422.

Figure 5B:
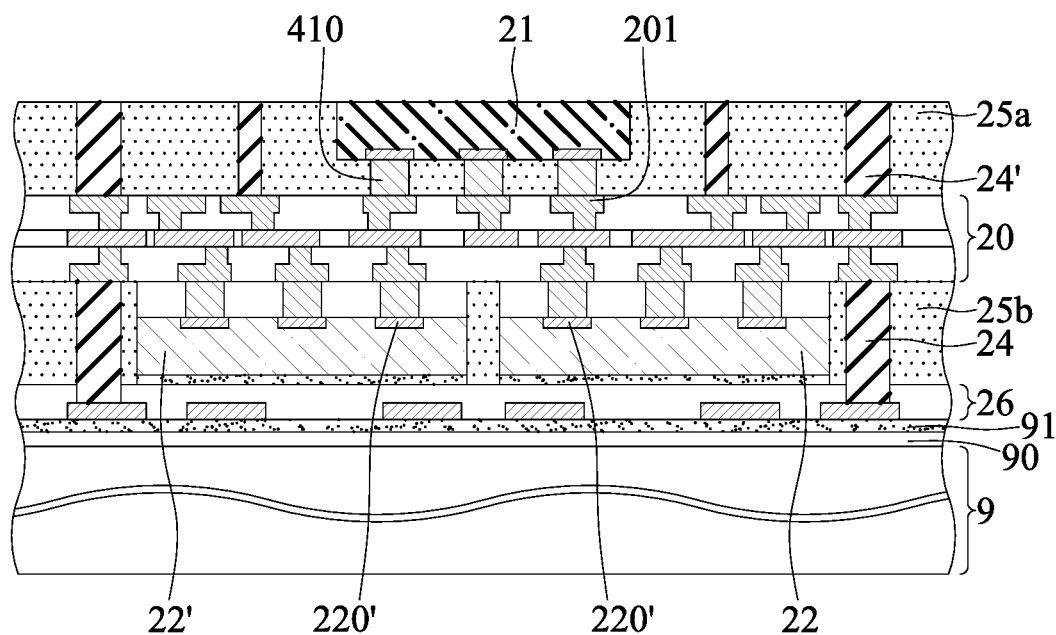

As shown in FIG. 5B, a circuit structure 20 is formed on the encapsulant 25b, and the circuit structure 20 is electrically connected with the conductive structures 24 and the conductors 422, such that the second electronic components 22, 22' can be electrically connected and grounded to the circuit structure 20 via the conductors 422. Next, at least one first electronic component 21 is disposed and a plurality of conductive structures 24' are formed on the circuit structure 20. The first electronic component 21 and the conductive structures 24' are then covered by an encapsulant 25a.

In an embodiment, the first electronic component 21 is electrically connected with the circuit layers 201 of the circuit structure 20 in a flip-chip manner via a plurality of conductive bumps 410, such as solder bumps, copper bumps or the like. The encapsulant 25a can simultaneously encapsulate the first electronic component 21 and the conductive bumps 410. It can be appreciated that an underfill (not shown) can first be formed between the first electronic component 21 and the circuit structure 20 to cover the conductive bumps 410. Then, the encapsulant 25a is formed to cover the underfill and the first electronic component 21.

Moreover, some electrode pads 220' of at least two of the second electronic components 22, 22' are electrically connected with one another via the circuit structure 20 and the first electronic component 21, wherein the first electronic component 21 achieves the purpose of electrical bridging.

In addition, the location of the first electronic component 21 with respect to the second electronic components 22, 22' can correspond to densely distributed regions P of the electrode pads 220' of the second electronic components 22, 22' (as shown in FIG. 2F-2).

In addition, a vertically projected area A of the top surface of the first electronic component 21 is smaller than vertically projected areas A', A" of the top surfaces of the second electronic components 22, 22' which it electrically bridges, as shown in FIG. 2F-2.

Furthermore, the size of the first electronic component 21 can be adjusted, thereby improving product reliability.

Figure 5C:
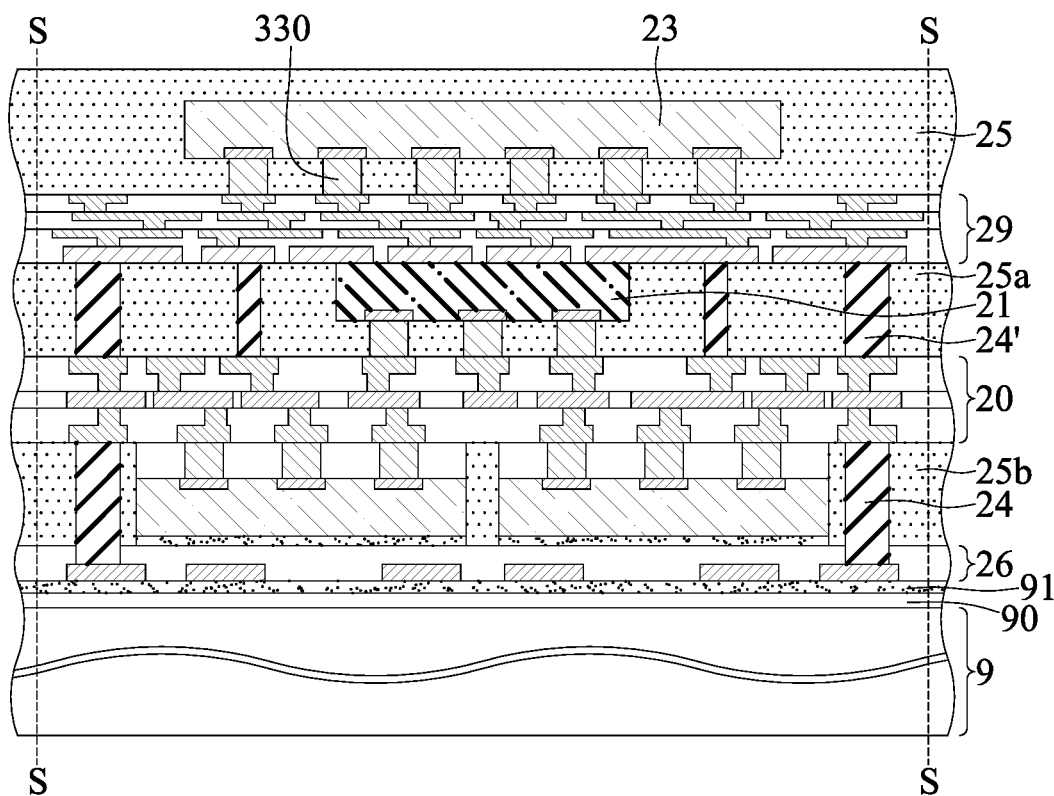

As shown in FIG. 5C, a wiring structure 29 is formed on the encapsulant 25a, and the wiring structure 29 is electrically connected with the conductive structures 24'. Next, at least one functional electronic component 23 is disposed on the wiring structure 29 and encapsulated by the encapsulation layer 25.

In an embodiment, the functional electronic component 23 is electrically connected with the circuit layers 291 of the wiring structure 29 in a flip-chip manner via a plurality of conductive bumps 330, such as solder or copper bumps or the like, and the encapsulation layer 25 can simultaneously cover the functional electronic component 23 and the conductive bumps 330. It can be appreciated that an underfill (not shown) can first be formed between the functional electronic component 23 and the wiring structure 29 to cover the conductive bumps 330. Thereafter, the encapsulation layer 25 is formed to cover the underfill and the functional electronic component 23.

Figure 5D:
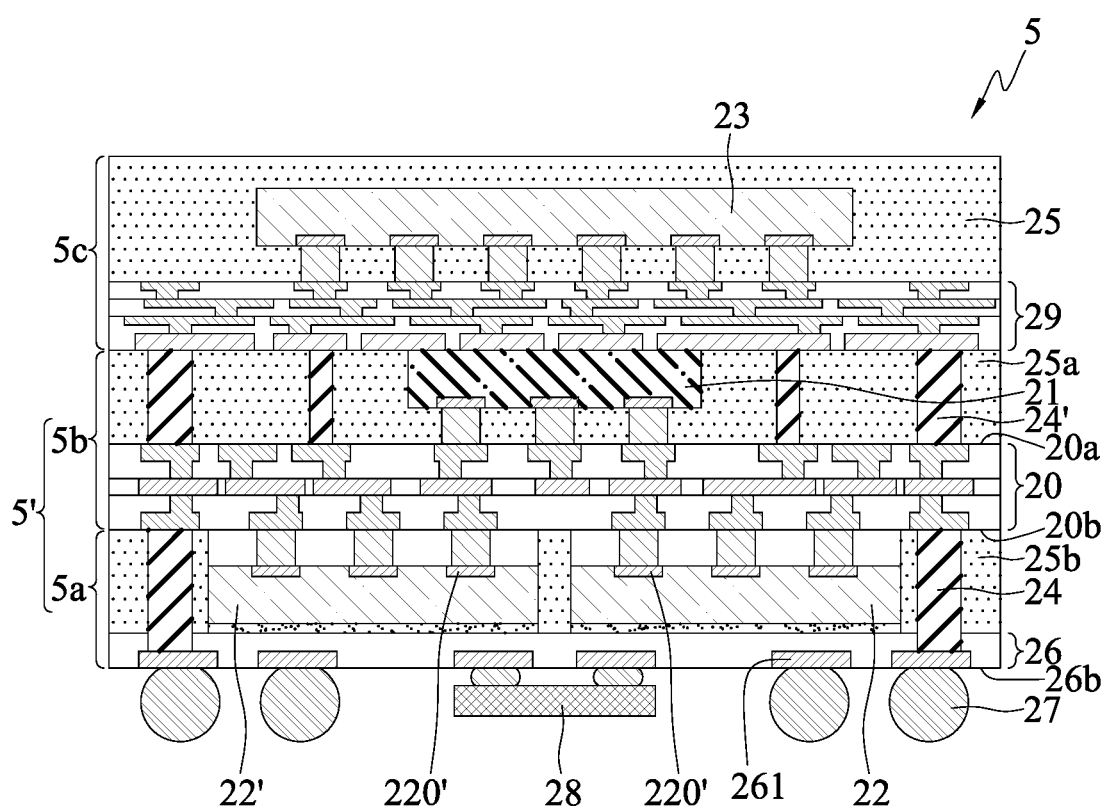

As shown in FIG. 5D, a singulation process is performed along cutting paths S shown in FIG. 5C, and the carrier 9 and the release layer 90 thereon are removed, and the bonding layer 91 can also be removed depending on the needs. As such, the second side 26b of the wiring structure 26 is exposed, thereby forming the electronic package 5.

In an embodiment, a plurality of conductive components 27 (e.g., solder balls) that are electrically connected with the circuit layer 261 are formed on the second side 26b of the wiring structure 26. Depending on the needs, at least one auxiliary electronic component 28 can be provided on the second side 26b of the wiring structure 26 and electrically connected with the circuit layer 261.

Moreover, the electronic package 5 is defined with a first package structure 5a, a second package structure 5b and a third package structure 5c.

The first package structure 5a includes the wiring structure 26, the second electronic components 22, 22', the conductive structures 24 and the encapsulant 25b.

The second package structure 5b includes the circuit structure 20, the first electronic component 21, the conductive structures 24' and the encapsulant 25a.

The third package structure 5c includes the wiring structure 29, the functional electronic component 23 and the encapsulation layer 25.

In an embodiment, the first package structure 5a and the second package structure 5b of the electronic package 5 are further defined as an electronic package body 5' with an electrical bridging structure.

Figure 6B:
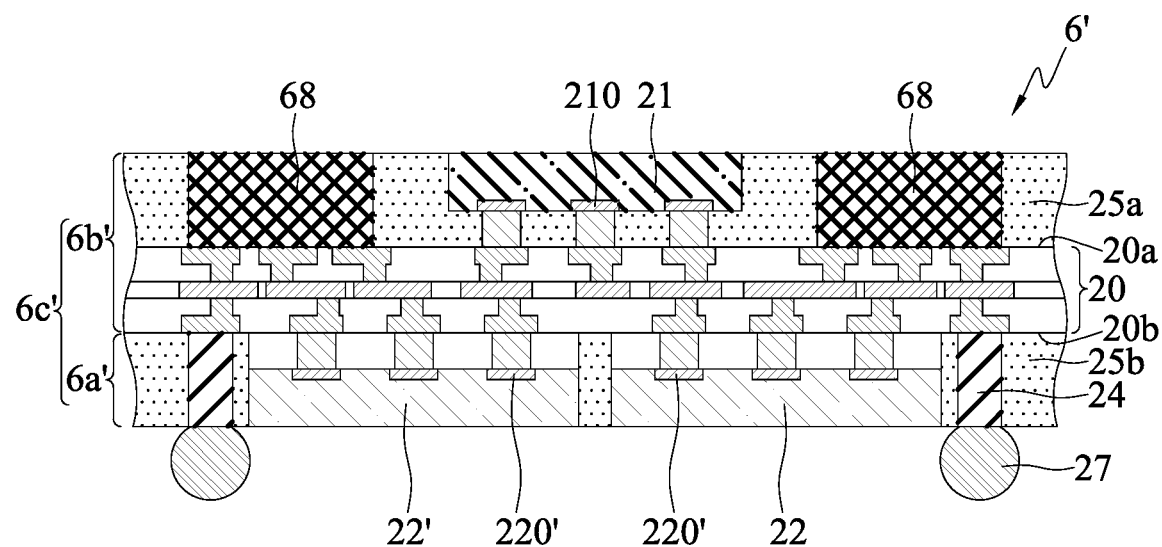

FIG. 6A and FIG. 6B are schematic cross-sectional diagrams illustrating a manufacturing method of an electronic package 6, 6' in accordance with a fifth embodiment of the present disclosure. This embodiment is different from the previous embodiments in that only the process related to the electronic package body having an electrical bridging structure is conducted. The rest of the process is generally the same and thus will not be repeated.

As shown in FIG. 6A, a plurality of conductive structures 24, at least one first electronic component 21 with a plurality of TSVs 610 and an encapsulant 25a are formed on a first side 26a of a wiring structure 26. The ends of the TSVs 610 are used as electrode pads 210. Next, a circuit structure 20 is formed on the encapsulant 25a, and a plurality of second electronic components 22, 22' are disposed on the circuit structure 20. The second electronic components 22, 22' are then covered by an encapsulant 25b. Thereafter, a singulation process is performed to form the electronic package 6. It can be appreciated that a plurality of conductive structures 24' can further be formed on the circuit structure 20 if needed, and the conductive structures 24' can then be covered by the encapsulant 25b.

In an embodiment, on the second side 26b of the wiring structure 26, a plurality of conductive components 27 (e.g., solder balls) are formed, and depending on the needs, at least one auxiliary electronic component 28 can be formed.

Moreover, the electronic package 6 is defined with a first package structure 6a and a second package structure 6b.

The first package structure 6a includes the wiring structure 26, the first electronic component 21, the conductive structures 24 and the encapsulant 25a.

The second package structure 6b includes the circuit structure 20, the second electronic components 22, 22', the conductive structures 24' and the encapsulant 25b.

In an embodiment, the first package structure 6a and the second package structure 6b of the electronic package 6 are further defined as an electronic package body 6c with an electrical bridging structure.

In addition, as shown in FIG. 6B, a plurality of conductive structures 24, a plurality of second electronic components 22, 22' and an encapsulant 25b are arranged on one side of a circuit structure 20, and at least one first electronic component 21 and an encapsulant 25a are arranged on the other side thereof (conductive structures can optionally be provided). Thereafter, a singulation process is performed, and a plurality of conductive components 27 (e.g., solder balls) are formed on the end surfaces of the conductive structures 24, thereby forming the electronic package 6'. Moreover, depending on the needs, at least one reinforcement component 68 can be provided on the circuit structure 20, such as a dummy die with no electrical functions, a pillar, a frame or a wall structure with no electrical functions or other suitable structures, in order to further reduce the risk of warpage.

In an embodiment, the electronic package 6' is defined with a first package structure 6a' and a second package structure 6b'.

The first package structure 6a' includes the second electronic components 22, 22', the conductive structures 24 and the encapsulant 25b.

The second package structure 6b' includes the circuit structure 20, the first electronic component 21 and the encapsulant 25a.

In an embodiment, the first package structure 6*a*' and the second package structure 6*b*' of the electronic package 6' are further defined as an electronic package body 6*c*' with an electrical bridging structure.

Therefore, in the manufacturing method of the present disclosure, the location of the first electronic component 21 in the electronic package body 2', 3', 4', 5', 6*c*, 6*c*' is arranged to correspond to the densely distributed regions P of the electrode pads 220' of the second electronic components 22, 22', so that a portion of the circuit layers 201 of the circuit structure 20 can be replaced by the first electronic component 21, thereby lowering the difficulty of the RDL wiring process of the circuit layers 201 for connecting with the densely distributed regions P. Thus, compared to the prior art, the present disclosure achieves high yield and low cost.

Furthermore, in the overlapped areas of the second electronic components 22, 22' and the first electronic component 21 in the electronic package body 2', 3', 4', 5', 6*c*, 6*c*' (that is, the local densely distributed regions P of the electrode pads 220, 220' of the second electronic components 22, 22'), portions of the RDL circuit layers 201 of the circuit structure 20 are replaced by the first electronic component 21. As a result, a higher yield can be obtained with the larger L/S of the circuit layers 201 of the circuit structure 20 (e.g., circuit layers 201 with 10/10 microns of L/S), while reducing the number of layers of the circuit structure 20 to be manufactured (e.g., less than three circuit layers 201). Thus, compared to the prior art, the manufacturing method of the present disclosure is capable of improving the process yield of the circuit structure 20 (or the RDLs), thereby reducing the manufacturing cost of the overall package structure of the electronic package 2, 3, 4, 5, 6, 6'.

In addition, the size of the first electronic component 21 can be adjusted to balance the stress distribution of the electronic package 2, 3, 4, 5, 6, 6', especially in stacked electronic package 2, 3, 4, 5 with more than three layers where stress distribution is a major issue. Thus, compared to the prior art, the manufacturing method of the present disclosure enhances the reliability of the electronic package 2, 3, 4, 5, 6, 6' by effectively preventing warpage through adjustment of the size of the first electronic component 21.

Moreover, in order to further improve the reliability of the electronic package 2, 3, 4, 5, 6, 6', at least one reinforcement component 68 (as shown in FIG. 6B) can be provided in the package structure having the first electronic component 21, such as a dummy die with no electrical functions, a pillar, a frame or a wall structure with no electrical functions or other suitable structures, in order to further reduce the risk of warpage.

The present disclosure further includes an electronic package 2, 3, 4, 5, 6, 6' comprising a circuit structure 20, at least one first electronic component 21, a plurality of second electronic components 22, 22' and at least one encapsulant 25*a*, 25*b*.

The circuit structure 20 includes at least one circuit layer 201, wherein the circuit structure 20 is defined with a first surface 20*a* and a second surface 20*b* opposite to each other.

The first electronic component 21 is disposed on the first surface 20*a* of the circuit structure 20 and electrically connected with the circuit layer 201.

The second electronic components 22, 22' are disposed on the second surface 20*b* of the circuit structure 20 and electrically connected with the circuit layer 201. Two of the plurality of second electronic components 22, 22' are electrically bridged by the first electronic component 21 via the circuit layer 201, wherein a vertically projected area A of the first electronic component 21 with respect to the first surface 20*a* is smaller than a vertically projected area A', A" of each of the second electronic components 22, 22' with respect to the first surface 20*a* and which the first electronic component 21 electrically bridges.

The encapsulant 25*a*, 25*b* covers the first electronic component 21 and/or the second electronic components 22, 22'.

In an embodiment, the vertically projected area A of the first electronic component 21 with respect to the first surface 20*a* is 0.01 to 0.5 times the vertically projected area A', A" of the second electronic component 22, 22' with respect to the first surface 20*a*.

In an embodiment, the first electronic component 21 covers a portion of a densely distributed region P of the second electronic component 22, 22' which it electrically bridges. For example, line width of the wiring specifications of the first electronic component 21 (e.g., the electrode pads 210) is 2 microns, and a plurality of electrode pads 220' electrically connected with the electrode pads 210 are provided on a portion of the densely distributed region P of the second electronic component 22, 22'.

In an embodiment, the first electronic component 21 is a bridge chip.

In an embodiment, a package structure electrically connected with the circuit structure 20 is provided on the encapsulant 25*a*, 25*b*, and the package structure includes a wiring structure 26, 29 and at least one functional electronic component 23 bonded to the wiring structure 26, 29. For example, the circuit structure 20 is electrically connected with the wiring structure 26, 29 via conductive structures 24, 24'.

In summary, the electronic package of the present disclosure and the manufacturing method thereof reduces the difficulty of the wiring process for the circuit structure by electrically bridging the plurality of second electronic components by the first electronic component. As such, the electronic package of the present disclosure and the manufacturing method thereof can achieve high yield and low cost.

Furthermore, in the overlapped areas of the second electronic components and the first electronic component, portions of the circuit layers of the circuit structure are replaced by the first electronic component. As a result, a larger L/S specification can be maintained for the circuit layers of the circuit structure, while reducing the number of layers of the circuit structure to be manufactured. Thus, the electronic package of the present disclosure and the manufacturing method thereof is capable of improving the process yield of the circuit structure, thereby reducing the manufacturing cost of the overall package structure of the electronic package.

In addition, the size of the first electronic component can be adjusted to effectively balance the stress distribution in the electronic package. Thus, the electronic package of the present disclosure and the manufacturing method thereof effectively prevent warpage issue by adjusting the size of the first electronic component.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
   a circuit structure having a first surface and a second surface opposite to each other and a circuit layer;

at least one first electronic component disposed on the first surface of the circuit structure and electrically connected with the circuit layer, wherein the first electronic component is free from being a functional chip and dimensions of the first electronic component are adjustable;

a plurality of second electronic components disposed on the second surface of the circuit structure and electrically connected with the circuit layer, wherein two of the plurality of second electronic components are electrically bridged by the first electronic component via the circuit layer, and wherein a vertically projected area of the first electronic component with respect to the first surface is smaller than a vertically projected area of each of the second electronic components which the first electronic component electrically bridges with respect to the first surface; and an encapsulant encapsulating at least one of the first electronic component and the second electronic components.

2. The electronic package of claim 1, wherein the vertically projected area of the first electronic component with respect to the first surface is 0.01 to 0.5 times the vertically projected area of at least one of two of the second electronic components to which the first electronic component electrically bridges with respect to the first surface.

3. The electronic package of claim 1, wherein the first electronic component covers a portion of the second electronic components which the first electronic component electrically bridges.

4. The electronic package of claim 3, wherein the portion of the second electronic components is defined as a densely distributed region of electrode pads.

5. The electronic package of claim 1, wherein the first electronic component is a bridge chip.

6. The electronic package of claim 1, further comprising a package structure provided on the encapsulant and electrically connected with the circuit structure, wherein the package structure includes a wiring structure and at least one functional electronic component bonded to the wiring structure.

7. The electronic package of claim 6, wherein the circuit structure is electrically connected with the wiring structure via conductive structures.

8. A method of manufacturing an electronic package, comprising:

providing a circuit structure having a first surface and a second surface opposite to each other and a circuit layer;

arranging at least one first electronic component on the first surface of the circuit structure and arranging a plurality of second electronic components on the second surface of the circuit structure, wherein two of the plurality of second electronic components are electrically bridged by the first electronic component via the circuit layer, and wherein a vertically projected area of the first electronic component with respect to the first surface is smaller than a vertically projected area of each of the second electronic components which the first electronic component electrically bridges with respect to the first surface; and encapsulating at least one of the first electronic component and the second electronic components by an encapsulant, wherein the first electronic component is free from being a functional chip and dimensions of the first electronic component are adjustable.

9. The method of claim 8, wherein the vertically projected area of the first electronic component with respect to the first surface is 0.01 to 0.5 times the vertically projected area of at least one of two of the second electronic components to which the first electronic component electrically bridges with respect to the first surface.

10. The method of claim 8, wherein the first electronic component covers a portion of the second electronic components which the first electronic component electrically bridges.

11. The method of claim 10, wherein the portion of the second electronic components is defined as a densely distributed region of electrode pads.

12. The method of claim 8, wherein the first electronic component is a bridge chip.

13. The method of claim 8, further comprising providing a package structure electrically connected with the circuit structure on the encapsulant, wherein the package structure includes a wiring structure and at least one functional electronic component bonded to the wiring structure.

14. The method of claim 13, wherein the circuit structure is electrically connected with the wiring structure via conductive structures.

* * * * *